(12) United States Patent
Stoddard

(10) Patent No.: US 11,248,312 B2
(45) Date of Patent: Feb. 15, 2022

(54) CONTINUOUS REPLENISHMENT CRYSTAL GROWTH

(71) Applicant: II-VI Delaware, Inc., Wilmington, DE (US)

(72) Inventor: Nathan Stoddard, Winchester, CA (US)

(73) Assignee: II-VI DELAWARE, INC., Wilmington, DE (US)

(*) Notice: Subject to any disclaimer, the term of this patent is extended or adjusted under 35 U.S.C. 154(b) by 192 days.

(21) Appl. No.: 16/694,226

(22) Filed: Nov. 25, 2019

(65) Prior Publication Data

US 2021/0156047 A1    May 27, 2021

(51) Int. Cl.
  *C30B 15/10*    (2006.01)
  *C30B 35/00*    (2006.01)
  *C30B 15/14*    (2006.01)

(52) U.S. Cl.
  CPC ............ *C30B 35/007* (2013.01); *C30B 15/10* (2013.01); *C30B 15/14* (2013.01)

(58) Field of Classification Search
  CPC ....... C30B 15/10; C30B 15/14; C30B 35/007; C30B 15/34; C30B 15/002
  See application file for complete search history.

(56) References Cited

U.S. PATENT DOCUMENTS

| | | | | |
|---|---|---|---|---|
| 4,090,851 A | * | 5/1978 | Berkman | C30B 15/08 117/211 |
| 4,353,875 A | * | 10/1982 | Yancey | C30B 15/005 117/211 |
| 4,366,024 A | * | 12/1982 | Ast | C30B 15/06 117/17 |
| 4,454,096 A | * | 6/1984 | Lorenzini | C30B 15/005 117/202 |
| 4,469,552 A | * | 9/1984 | Thornhill | C30B 15/24 117/211 |
| 5,085,728 A | | 2/1992 | Makintosh et al. | |
| 6,090,199 A | | 7/2000 | Wallace, Jr. et al. | |
| 2005/0227117 A1 | | 10/2005 | Locher et al. | |
| 2014/0090592 A1 | | 4/2014 | Memering et al. | |

FOREIGN PATENT DOCUMENTS

JP            201470016 A     4/2014

* cited by examiner

*Primary Examiner* — Matthew J Song
(74) *Attorney, Agent, or Firm* — Blank Rome LLP

(57) ABSTRACT

An apparatus for growing a crystal includes a growth chamber and a melt chamber thermally isolated from the growth chamber. The growth chamber includes: a growth crucible configured to contain a liquid melt; and a die located in the growth crucible, the die having a die opening and one or more capillaries extending from within the growth crucible toward the die opening. The melt chamber includes: a melt crucible configured to receive feedstock material; and at least one heating element positioned within the melt chamber relative to the melt crucible to melt the feedstock material within the melt crucible to form the liquid melt. The apparatus also includes at least one capillary conveyor in fluid communication with the melt crucible and the growth crucible to transport the liquid melt from the melt crucible to the growth crucible.

18 Claims, 4 Drawing Sheets

CONTINUOUS REPLENISHMENT CRYSTAL GROWTH

BACKGROUND OF THE DISCLOSURE

Field

The present disclosure generally relates to systems and methods for growing crystals from a melt and, more particularly, to systems and methods for growing crystals where the melt is continuously replenished during crystal growth.

Description of Related Art

Single crystal sapphire is the material of choice for optical applications involving high temperature, shock loading, and abrasion due to its optical properties, high strength, and abrasion and thermal shock resistance. Various methods have been developed for growing single crystal sapphire including the heat exchanger method, Edge-defined Film-fed Growth (EFG) techniques, and Czochralski (Cz) techniques.

A conventional crystal growth system requires a batch-based configuration where a single crucible is loaded with raw material. This raw material is melted into a single batch of liquid melt which is then drawn through the die during the crystal growth process. The amount of material in the melt determines the maximum crystal size, and the drop in the melt level as the solid crystal is formed has to be accounted for in the process design.

Systems have been designed for continuous replenishment of the melt. In one example, a segmented crucible with an inner and an outer area is provided. Solid material is dropped into the outer area and melted by outer heaters before flowing into the inner area to supply the crystal growth. Such a system suffers from various deficiencies. For instance, such a segmented crucible design requires the superheated area for melting the solid material to be relatively close to the crystal growth region, and the two cannot be decoupled thermally. This places significant limitations on the process window for successful crystal growth. In addition, the dropping of the solid material into the outer area causes disturbance in the overall liquid level which can lead to the loss of a single crystal structure. Still further, the thermal gradients in the liquid melt cause complex and sometimes deleterious convection patterns to develop, which tend to increase the presence of inclusions in the crystals (either voids or small pieces of unmelted solid or other foreign particles). Finally, such segmented crucibles are typically complicated and quite expensive to make.

SUMMARY OF THE DISCLOSURE

In accordance with one aspect of the present disclosure, provided is an apparatus for growing a crystal. The apparatus comprises a growth chamber and a melt chamber thermally isolated from the growth chamber. The growth chamber comprises: a growth crucible configured to contain a liquid melt; and a die located in the growth crucible, the die having a die opening and one or more capillaries extending from within the growth crucible toward the die opening. The melt chamber comprises: a melt crucible configured to receive feedstock material; and at least one heating element positioned within the melt chamber relative to the melt crucible to melt the feedstock material within the melt crucible to form the liquid melt. The apparatus also comprises at least one capillary conveyor in fluid communication with the melt crucible and the growth crucible to transport the liquid melt from the melt crucible to the growth crucible.

In accordance with another aspect of the present disclosure, a method of growing a crystal comprises: providing a growth crucible having a die located therein; providing a melt crucible thermally isolated from the growth crucible; melting feedstock material provided within the melt crucible to form a liquid melt; and transporting the liquid melt from the melt crucible to the growth crucible with at least one capillary conveyor provided in fluid communication with the melt crucible and the growth crucible.

These and other features and characteristics of the apparatus of the present disclosure, as well as the methods of operation and functions of the related elements of structures and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the device of the present disclosure. As used in the specification and the claims, the singular form of "a", "an", and "the" include plural referents unless the context clearly dictates otherwise.

DESCRIPTION OF THE INVENTION

Figure 1:
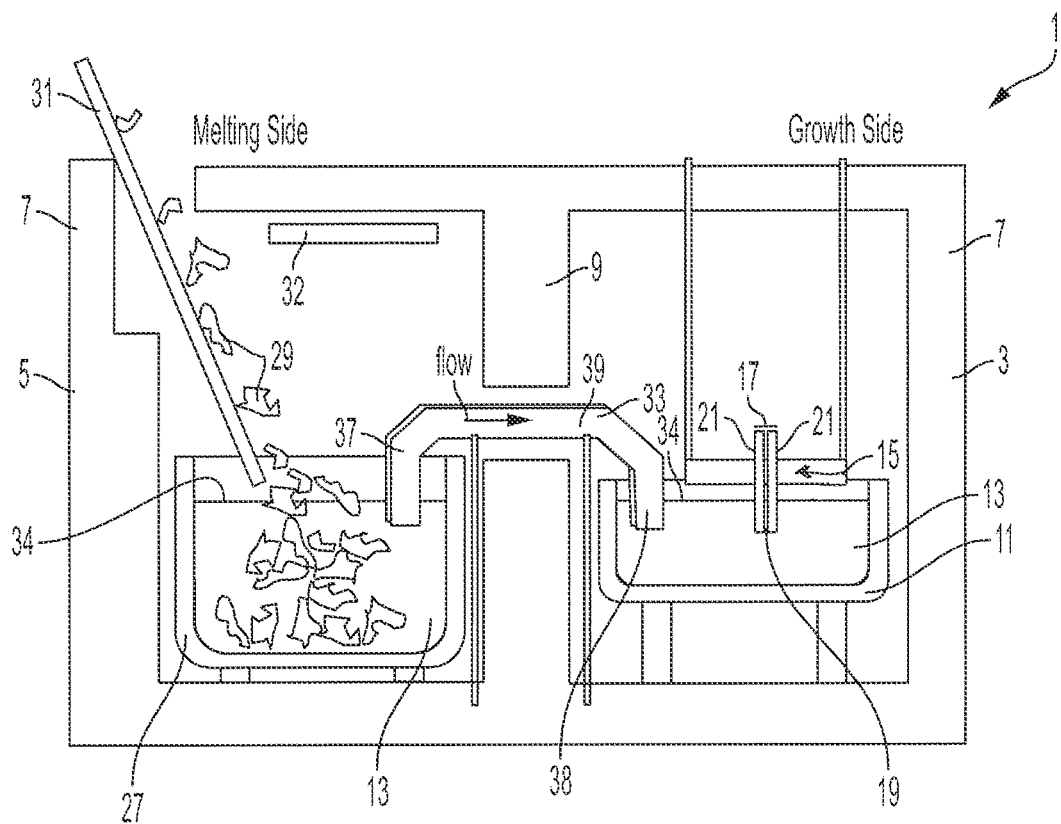
FIG. 1 is a schematic cross-sectional view of an apparatus for growing a crystal in accordance with the present disclosure.
Figure 2:
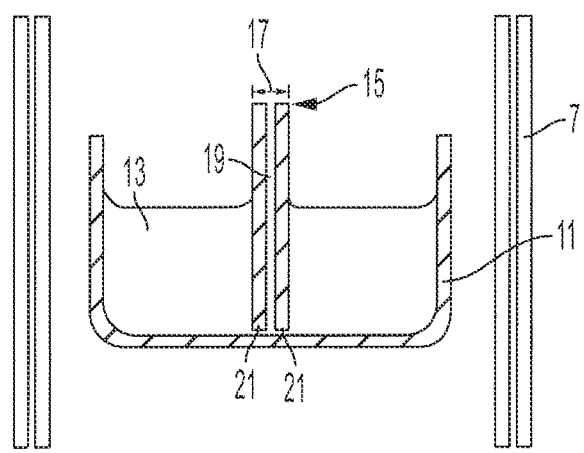
FIG. 2 is a schematic cross-sectional view of a portion of the growth crucible of the apparatus for growing a crystal of FIG. 1.
Figure 3:
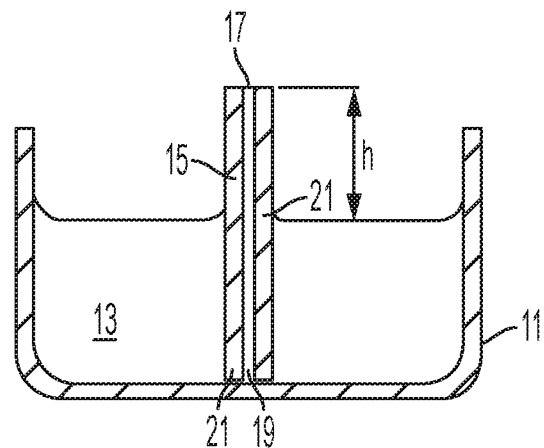
FIG. 3 is another schematic cross-sectional view of the portion of the growth crucible of FIG. 1.
Figure 4A:
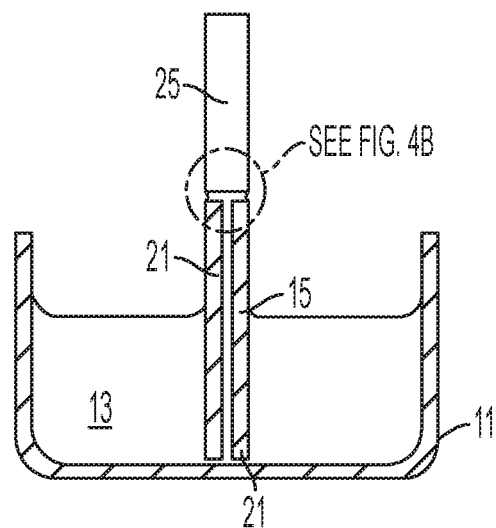
FIG. 4A is a schematic cross-sectional view of the growth crucible of FIG. 3 illustrating a crystal being grown.
Figure 4B:
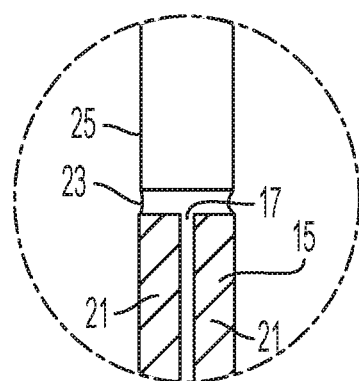
FIG. 4B is a portion of the schematic cross-sectional view of FIG. 2 enlarged for magnification purposes.

For purposes of the description hereinafter, the terms "upper", "lower", "right", "left", "vertical", "horizontal", "top", "bottom", "lateral", "longitudinal", and derivatives thereof shall relate to the invention as it is oriented in the drawing figures. However, it is to be understood that the invention may assume alternative variations and step sequences, except where expressly specified to the contrary. It is also to be understood that the specific devices and processes illustrated in the attached drawings, and described in the following specification, are simply exemplary embodiments of the invention. Hence, specific dimensions and other physical characteristics related to the embodiments disclosed herein are not to be considered as limiting.

Unless otherwise indicated, all ranges or ratios disclosed herein are to be understood to encompass any and all subranges or subratios subsumed therein. For example, a stated range or ratio of "1 to 10" should be considered to include any and all subranges between (and inclusive of) the minimum value of 1 and the maximum value of 10; that is, all subranges or subratios beginning with a minimum value of 1 or more and ending with a maximum value of 10 or less, such as but not limited to, 1 to 6.1, 3.5 to 7.8, and 5.5 to 10.

With reference to FIG. 1, an apparatus for growing a crystal, generally denoted as reference numeral 1, comprises a growth chamber 3 and a melt chamber 5 thermally isolated from the growth chamber 3. In one example, the growth chamber 3 and the melt chamber 5 are positioned side-by-side as shown in FIG. 1. Each chamber 3, 5, is surrounded by an insulation housing 7 with an insulation wall 9 thermally isolating the growth chamber 3 from the melt chamber 5.

The growth chamber 3, shown in a cross-sectional cut with growth die plates 21 extending into the page, comprises: a growth crucible 11 configured to contain a liquid melt 13 of material to be crystalized; and one or more dies 15 positioned within the growth crucible 11. While FIG. 1 illustrates that one die 15 may be positioned within the growth crucible 11, this is not to be construed as limiting the present disclosure as any suitable number of dies 15 may be utilized. Die 15 includes a die opening 17 and one or more capillaries 19 extending from within the growth crucible 11 toward the die opening 17. A seed crystal moving mechanism (not shown) is also provided in the growth chamber 3 to move the seed crystal(s) away from the die 15 as the crystal is forming.

With reference to FIGS. 2, 3, 4A, and 4B, and with continued reference to FIG. 1, additional details of the growth crucible 11 and die 15 are discussed. For ease of explanation, FIGS. 2, 3, 4A, and 4B only illustrate one die 15 positioned within the growth crucible 11. In addition, the description hereinafter is related to an EFG technique for crystal growth. However, this is not to be construed as limiting the present disclosure, as the principles disclosed herein with regard to continuous replenishment of a crucible are applicable to other crystal growth techniques such as Czochralski (Cz) techniques. As discussed above, the growth crucible 11 contains a liquid melt 13 of the material to be crystallized, such as $Al_2O_3$ powder. One or more heaters (not shown) may be positioned to supply heat to the growth crucible 11.

In general, the die material is selected such that it is chemically inert with respect to the liquid melt, but is wetted by the liquid melt. Wetting is indicated by the formation of a meniscus of liquid melt at the top of die. The size (i.e., height) and shape of the meniscus is determined by the surface tension between the molten material and the solid comprising the die, as well as the density of the liquid melt and gravity. The growth interface, where the crystal is formed, is at the top surface of the die. Liquid melt is delivered to the top surface of the die by capillary flow of liquid rising through the capillaries 19 in the die 15. The die 15 includes two adjacent rectangular die plates 21 extending in and out of the plane of the drawing. The die plates 21 are typically separated by spacers (not shown) so that the die plates 21 are only separated by a small distance, typically from 0.05 cm to 0.3 cm, which corresponds to the width of the capillary 19. The die opening 17 is defined as the distance from the outer edge of one die plate 21 to the outer edge of the other, and determines the thickness of the crystal. The arrangements of the die plates 21 result in capillaries 19 through which the melt flows from the growth crucible 11 to the die opening 17. The melt then flows to the die opening 17 to form a thin wetting layer of melted material (the meniscus 23) having boundaries at the outer edges of the die plates 21 (see FIGS. 4A and 4B). The crystal growth occurs at the solid/liquid interface at the upper surface of the thin wetting layer of melted material, with the resulting crystal 25 having a thickness spanning the die opening 17 (as defined above). After a spreading process from the initial seed crystal, the final width of the crystal is determined by the length of the die (in and out of the plane of the drawing). The height is determined by how long and how fast the crystal pulling process proceeds . . . = With specific reference to FIG. 3, the height (h) above the surface of the liquid melt that the liquid will rise in the capillaries 19 is determined by the dimensions of the capillaries 19, the surface tension between the melt and the die material, the density of the melt, and gravity.

A seed crystal (not shown), cut from a previously grown crystal, is brought into contact with the top of the die. Due to the high thermal gradient at the die, portions of the seed melt on contact with the die, and the thin liquid layer eventually merges with the capillary liquid. As the seed is pushed further down, eventually the solid bottom edge of the seed becomes conformal with the die surface 15. Once this intimate wetted contact is established and a full meniscus 23 is present, the seed can be pulled up, away from the die 15 at a predetermined speed. As the seed crystal is withdrawn, the melt material crystallizes onto the seed crystal. While initial seed contact is made at only one point on the die (e.g. the center), with proper thermal management the meniscus 23 spreads across the length of the die 15 (in and out of the plane of the drawing). The spreading is caused by the progressive lateral freezing of the meniscus at the edges of the crystal (not shown in cross-section). The meniscus spreads until it reaches the edge of the die 15. Various physical principles prevent the meniscus from going beyond the edge of the die. As long as the angle formed by the edges of the die 15 is 90° or less, the meniscus 23 is constrained by the edge of the die 15. As the seed crystal is raised, the meniscus 23 spreads across the surface of the die 15, and the crystal spreads as well (quickly in the left/right directions, slowly in/out of plane). Temperature adjustments to the growth crucible 11, to the cavity into which the seed is pulled, and/or adjustments to the seed lift rate are made as required to promote the spread of the crystal across the surface of the die 15 and to control its growth rate. When the crystal reaches the shape defined by the edges of the die 15 in both dimensions, its final form is set by the edges of the die 15.

At that point, a steady state equilibrium is established, and, as long as liquid continues to be delivered to the surface of the die 15 by capillary action from the melt 13, a crystal of constant cross-section defined by the top surface of the die 15 is grown. The heaters used to maintain the growth crucible 11 and the inside of the growth chamber 3 at the appropriate temperature are chosen by factors such as the size of the crucible/crystal, the geometry of the crucible (round, rectangular), and the power requirements. In some instances, induction heating may be employed. Other systems utilize resistance heating elements. A hybrid approach may also be utilized in which induction coils are used to heat a susceptor (usually graphite in the case of sapphire growth), whereby the susceptor then acts like a resistance heating element that radiates heat to the crucible.

In addition, the apparatus may also include an afterheater (not shown). The afterheater sits above the growth crucible 11 and provides an environment in which the crystal's temperature drops gradually from the freezing point to some intermediate value below the freezing point but significantly above room temperature, such as around 1800° C. in the case of sapphire crystal growth. Then, once growth is completed and the crystal has been separated from the die, it can be cooled down to room temperature in a controlled fashion. The afterheater can be either active or passive. A passive afterheater receives heat radiated or conducted from the hot zone containing the growth crucible 11. An active afterheater has its own heat source. This can be controlled separately from the main heat source heating the growth crucible 11 and thus be independent, or it can utilize the same power supply, in which case its time-temperature profile tracks that of the growth crucible 11 albeit at a lower value.

Returning to FIG. 1, the melt chamber 5 of the apparatus comprises a melt crucible 27 configured to receive feedstock material 29, such as $Al_2O_3$ powder if sapphire single crystal is intended to be formed by the apparatus. The feedstock material 29 may be provided to the melt crucible 27 by any suitable conveying mechanism such as, but not limited to, a ramp 31. Other conveying mechanisms include a vibratory feeder, a rotary feeder, a tilting hopper, or an air-pressure modulated feeder. The feed rate at which the feedstock material 29 is added to the melt crucible 27 is carefully monitored using appropriate sensors (not shown). The feed rate of the feedstock material 29 into the melt crucible 27 must be controlled to at least roughly match the rate of crystal growth using appropriate control mechanisms based on feedback from the sensors.

In addition, the melt chamber 5 is provided with one or more heating elements 32 positioned therein relative to the melt crucible 27 to melt the feedstock material 29 within the melt crucible 27 to form the liquid melt 13. The heating element 32 may be an inductive heating element, a resistive heating element, or a hybrid of both inductive and resistive heating elements. In one example, the melt chamber 5 may be designed using induction heating to maximize efficiency while the growth chamber 3 may utilize resistive heating.

In some examples, the melt crucible 27 may have a much smaller or much larger volume than the growth crucible 11. For instance, the melt crucible may have a volume of about 1,500 $cm^3$ to about 100,000 $cm^3$ and the growth crucible may have a volume of about 13,000 $cm^3$ to about 50,000 $cm^3$. The use of a larger melt crucible 27 provides additional stability to the process because it requires a significant amount of material to be needed to change the net liquid melt level.

The isolation of the melt crucible 27 from the growth crucible 11 provides several advantages over existing systems for growing crystals. For instance, the delivery of feedstock material 29 into the melt crucible 27 may create disturbances in temperature or fluid flow therein which would negatively affect the crystal if such disturbances occurred in the growth crucible 11. However, since the melt crucible 27 is completely isolated from the growth crucible 11, such disturbances do not affect crystal growth. In addition, the heating elements 32 in the melt chamber 5 can be run at a high rate in order to drive efficient melting without affecting the temperature distribution in the growth chamber 3.

The apparatus 1 also comprises a capillary conveyor 33 in fluid communication with the melt crucible 27 and the growth crucible 11 to transport the liquid melt 13 from the melt crucible 27 to the growth crucible 11 via capillary action caused by depletion of the liquid melt 13 in the growth crucible 11 as the crystal 25 is grown such that a liquid melt level 34 in the melt crucible 27 is the same as the liquid melt level in the growth crucible 11. While only a single capillary conveyor 33 is illustrated in FIG. 1, this is not to be construed as limiting the present disclosure as two or more capillary conveyors may be utilized to transport the liquid melt 13 from the melt crucible 27 to the growth crucible 11. Similarly, in order to control the cost of the melting crucible, several small melting crucibles might be used in place of a large one, where each is connected via capillary channels to the others.

Figure 5:
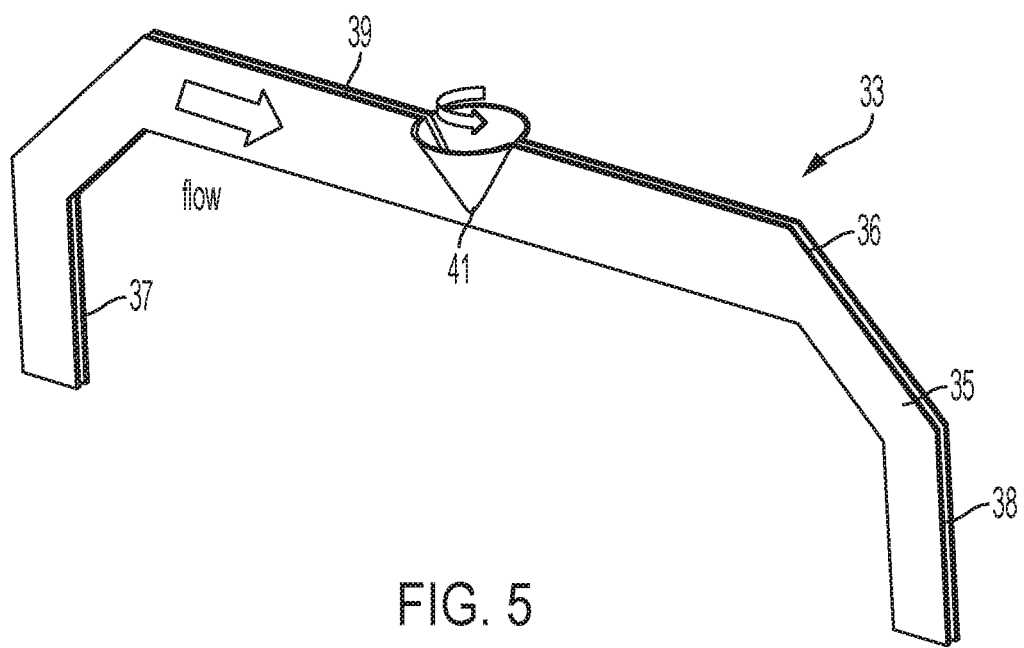
FIG. 5 is an enlarged perspective view of a capillary conveyor of the apparatus for growing a crystal of FIG. 1.

With reference to FIG. 5, and with continued reference to FIG. 1, the capillary conveyor 33 is formed from a pair of flat metallic plates 35 positioned a distance apart forming a capillary channel 36 having a controlled gap-width therebetween. The width of the capillary channel 36 must be sufficiently small to assure the natural wetting of the liquid melt 13 from the liquid melt level 34 within the melt crucible 27 to the top of the capillary conveyor 33. In some examples, this width may be about 0.05 cm to about 0.3 cm apart. The pair of flat metallic plates 35 may each have an upside down U-shape with a first leg 37 of the upside down U-shape being positioned within the melt crucible 27, a second leg 38 of the upside down U-shape being positioned within the growth crucible 11, and a portion 39 extending between the first leg 37 and the second leg 38. The portion 39 extending between the first leg 37 and the second leg 38 optionally includes at least one rotary flow element, such as cone-shaped element 41, provided in a path of the liquid melt. The rotary flow element comprises a cavity between the two plates 35 with a geometry conducive to rotational flow. Accordingly, while a cone-shaped element 41 is illustrated in FIGS. 5-7 and will be discussed hereinafter, this is not to be construed as limiting the present disclosure as any suitable cavity having a geometry configured to create a rotational flow may be utilized as the rotary flow element.

Figure 6:
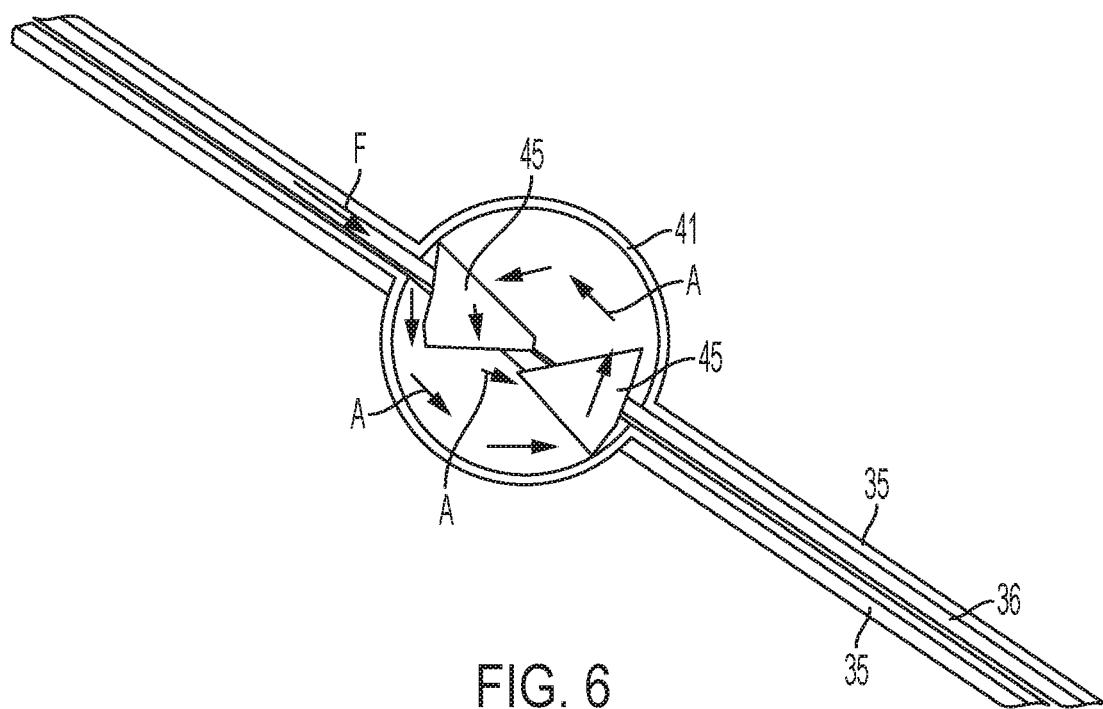
FIG. 6 is an enlarged top view of a portion of the capillary conveyor of FIG. 5 illustrating the details of a cone-shaped element of the capillary conveyor.
Figure 7:
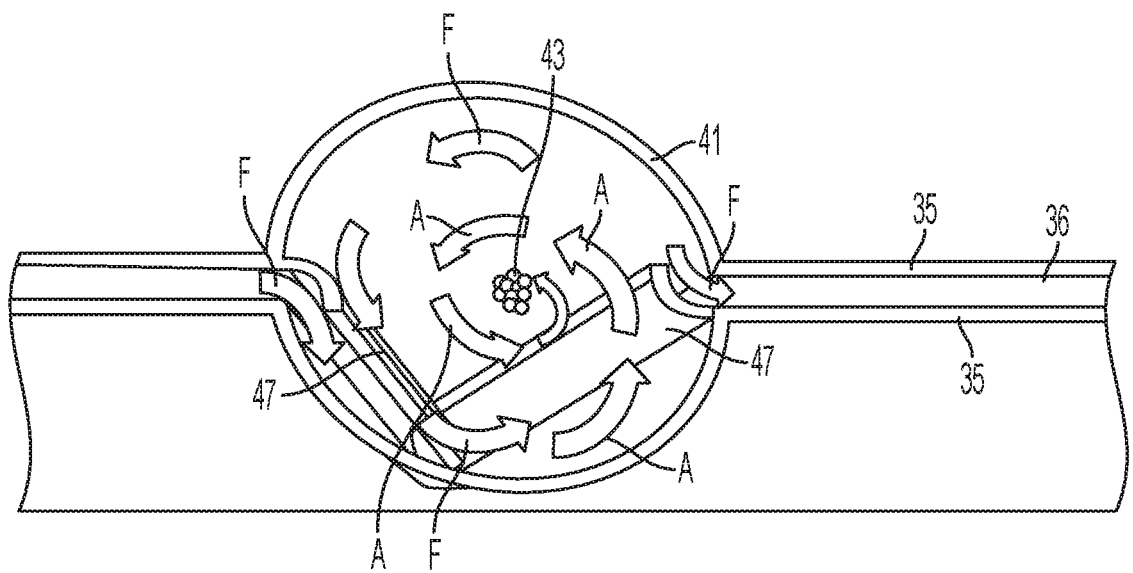
FIG. 7 is an enlarged top view of a portion of the capillary conveyor of FIG. 5 illustrating an alternative example of the cone-shaped element.

With reference to FIG. 1 and with continued reference to FIGS. 5-7, the entire length of the capillary conveyor 33 must be maintained comfortably above the melting temperature of the feedstock material. Accordingly, appropriate insulation must be provided surrounding the capillary conveyor 33. In addition, heaters (not shown) may be provided near or around the capillary conveyor 33. However, it should be noted that the passage of the capillary conveyor 33 into the growth chamber 3 is configured to thermally isolate the melt chamber 5 and the growth chamber 3 as much as possible while still maintaining capillary conveyor 33 above the melting temperature of the feedstock material.

One of the primary problems in crystal growth is the presence of microscopic bubbles. The presence of such bubbles is deleterious to use as an optical material, causing scattering of light. Small bubbles are basically stable in a sapphire melt and, for EFG crystal growth, can travel up through the capillaries and into the grown material. The cone-shaped element 41 acts as a bubble trap in the capillary conveyor 33 such that bubbles are eliminated prior to reaching the growth crucible 11. With reference to FIGS. 6 and 7, the capillary channel 36 of the capillary conveyor 33 includes the at least one cone-shaped element 41 through which almost all of the liquid melt would pass in the direction of arrows F. The cone-shaped element 41 creates a vortex convection due to its geometry and the flow passing through. Such a vortex concentrates bubbles 43 towards the center as denoted by arrows A because these bubbles 43 are less dense than the surrounding area. The bubbles 43 are thereby trapped in the volume of the cone-shaped element 41 and do not flow through to the second half of the capillary conveyor 33 that leads to the growth crucible 11. Natural buoyancy pushes the bubbles 43 towards the top of the cone-shaped element 41, where the central tendency of the centripetal force is greatest. In the center, the bubbles 43 agglomerate and eventually "pop", leaving the liquid melt altogether.

In addition, the cone-shaped element 41 may comprise at least one portion, such as fins 45 (see FIG. 6) or arc-shaped portions 47 (see FIG. 7), extending from an inner surface thereof. Such portions cause the bubbles 43 to move to a central area of the cone-shaped element 41. More specifically, such portions help to create circular flow within the cone-shaped element 41, thereby guiding the bubbles 43 to the center of the cone-shaped element 41.

In operation, the apparatus 1 functions as follows. First, feedstock material 29 is provided to the melt crucible 27 by any suitable conveying mechanism where the feedstock material 29 is melted to form the liquid melt 13 as described hereinabove. Thereafter, the liquid melt 13 from the melt crucible 27 is transported to the growth crucible 11 with capillary conveyor 33 provided in fluid communication with the melt crucible 27 and the growth crucible 11. As such, the growth crucible 11 contains the liquid melt 13, and the dies 15 are mounted partly within the growth crucible 11. As described hereinabove, the dies 15 have one or more capillaries 19 extending from within the growth crucible 11 to the die opening 17. Capillary action is used to draw liquid melt 13 from the growth crucible 11 through the one or more capillaries 19 and onto the surface of the die openings 17 of each of the dies 15. Next, a seed crystal is inserted into the liquid melt 13 on the surface of the die opening, and then the seed crystal is pulled away from the surface of the die opening 17 in a controlled manner to grow a crystal. After the crystal is formed, the growth process is stopped by quickly removing the panel(s) from the die, breaking the liquid contact, and the crystal can be removed for further processing (such as grinding, polishing, lapping, or the removal of bulk material).

Accordingly, the apparatus and method of the present disclosure offer several advantages over the conventional batch-based approach. First, the size of the growth crucible 11 and the initial volume of liquid melt 13 provided in the growth crucible 11 no longer limits the size of the final crystal. In many cases, this allows the size of the growth crucible 11 to be decreased which reduces crucible costs and increases the process safety by decreasing the size of potential melt spills. At the same time, the final crystal size can actually be larger than in conventional batch processes since crucible size is often a limitation both in cost and in space in the apparatus. The resulting process yield is higher because less time is spent in turn-overs. The overall throughput also increases because the time that is normally spent melting the feedstock material is put in parallel to the growth process. A small amount is melted at the beginning, and the remainder is melted on-the-fly during the growth process. Finally, the process is typically more stable in continuous replenishment because the melt level can be maintained at a constant value throughout the process. In EFG techniques, this means that the supply of material through the capillary will remain constant and not decrease as the crystal is pulled. In Cz techniques, this means that the crucible does not need to be raised in order to maintain a steady melt level in the furnace, and that the convective flow in the melt can be kept in a steady state.

While specific embodiments of the device of the present disclosure have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the device of the present disclosure which is to be given the full breadth of the claims appended and any and all equivalents thereof.

The invention claimed is:

1. A method of growing a crystal comprising:
providing a growth crucible having a die located therein;
providing a melt crucible thermally isolated from the growth crucible;
melting feedstock material provided within the melt crucible to form a liquid melt; and
transporting the liquid melt from the melt crucible to the growth crucible with at least one capillary conveyor provided in fluid communication with the melt crucible and the growth crucible, and
wherein the at least one capillary conveyor is formed from a pair of plates positioned a distance apart.

2. The method of claim 1, wherein the die comprises a die opening and one or more capillaries extending from within the growth crucible toward the die opening.

3. The method of claim 2, further comprising: using capillary action to draw the liquid melt within the growth crucible through the one or more capillaries and out of the die opening; and merging a crystal seed into the liquid melt adjacent to the die opening and then pulling the seed away from the die opening at a rate to grow the crystal.

4. The method of claim 1, wherein the feedstock material is provided to the melt crucible by a feedstock conveyor in communication with the melt crucible.

5. The method of claim 1, wherein the melt crucible has a larger volume than the growth crucible.

6. The method of claim 1, wherein the capillary conveyor is positioned to transport liquid melt from the melt crucible to the growth crucible via capillary action caused by depletion of the liquid melt in the growth crucible as a crystal is grown such that a liquid melt level in the melt crucible is the same as the liquid melt level in the growth crucible.

7. The method of claim 1, wherein the method includes growing a sapphire crystal.

8. A method of growing a crystal comprising:
providing a growth crucible having a die located therein;
providing a melt crucible thermally isolated from the growth crucible;
melting feedstock material provided within the melt crucible to form a liquid melt; and
transporting the liquid melt from the melt crucible to the growth crucible with at least one capillary conveyor provided in fluid communication with the melt crucible and the growth crucible, and
wherein the at least one capillary conveyor is formed from a pair of metallic plates positioned a distance apart.

9. The method of claim 8, wherein the pair of metallic plates each have an upside down U-shape with a first leg of the upside down U-shape being positioned within the melt crucible, a second leg of the upside down U-shape being positioned within the growth crucible, and a portion extending between the first leg and the second leg.

10. The method of claim 8, wherein the feedstock material is provided to the melt crucible by a feedstock conveyor in communication with the melt crucible.

11. The method of claim 8, wherein the melt crucible has a larger volume than the growth crucible.

12. The method of claim 8, wherein the capillary conveyor is positioned to transport liquid melt from the melt crucible to the growth crucible via capillary action caused by depletion of the liquid melt in the growth crucible as a crystal is grown such that a liquid melt level in the melt crucible is the same as the liquid melt level in the growth crucible.

13. The method of claim 8, wherein the method includes growing a sapphire crystal.

14. A method of growing a crystal comprising:
providing a growth crucible having a die located therein;
providing a melt crucible thermally isolated from the growth crucible;
melting feedstock material provided within the melt crucible to form a liquid melt; and
transporting the liquid melt from the melt crucible to the growth crucible with at least one capillary conveyor provided in fluid communication with the melt crucible and the growth crucible,
wherein the at least one capillary conveyer includes a first leg positioned within the melt crucible and a second leg positioned within the growth crucible, and
wherein the transporting of the liquid melt from the melt crucible to the growth crucible includes removing at least some bubbles from the liquid melt by flowing the liquid melt through at least one rotary flow element provided in a path of the liquid melt between the first leg of the least one capillary conveyor and the second leg of the at least one capillary conveyor.

15. The method of claim 14, wherein the feedstock material is provided to the melt crucible by a feedstock conveyor in communication with the melt crucible.

16. The method of claim 14, wherein the melt crucible has a larger volume than the growth crucible.

17. The method of claim 14, wherein the capillary conveyor is positioned to transport liquid melt from the melt crucible to the growth crucible via capillary action caused by depletion of the liquid melt in the growth crucible as a crystal is grown such that a liquid melt level in the melt crucible is the same as the liquid melt level in the growth crucible.

18. The method of claim 14, wherein the method includes growing a sapphire crystal.

\* \* \* \* \*